United States Patent [19]

Tanaka

[11] Patent Number: 4,716,759

[45] Date of Patent: Jan. 5, 1988

[54] METHOD OF DETECTING CYLINDER PRESSURE AND CYLINDER PRESSURE DETECTION DEVICE IN INTERNAL COMBUSTION ENGINE

[75] Inventor: Akira Tanaka, Wako, Japan

[73] Assignee: Honda Giken Kogyo Kabushiki Kaisha, Tokyo, Japan

[21] Appl. No.: 937,153

[22] Filed: Dec. 2, 1986

[30] Foreign Application Priority Data

Dec. 2, 1985 [JP] Japan .................................. 60-271120
Dec. 2, 1985 [JP] Japan .................................. 60-271121
Dec. 2, 1985 [JP] Japan .................................. 60-271122

[51] Int. Cl.⁴ .......................................... G01M 15/00
[52] U.S. Cl. .......................................... 73/115; 73/709
[58] Field of Search .......................... 73/115, 35, 709; 364/431.3, 431.4, 431.5; 123/494

[56] References Cited

U.S. PATENT DOCUMENTS 4,481,924 11/1984 Kobayashi ........................... 73/35 X
4,565,087 1/1986 Damson et al. ........................ 73/35

Primary Examiner—Jerry W. Myracle
Attorney, Agent, or Firm—Armstrong, Nikaido, Marmelstein & Kubovcik

[57] ABSTRACT

A method of detecting cylinder pressure and a cylinder pressure detection device in an internal combustion engine. Two reference values are set and then adjusted so that the maximum pressure value output by a cylinder pressure sensor falls between them. At least one of the reference values is then approximated to the maximum output and the magnitude of the approximated reference value is deemed to represent the maximum value. The crank angle at which the detected maximum pressure value occurred is determined with respect to reference point such as top dead center.

9 Claims, 17 Drawing Figures

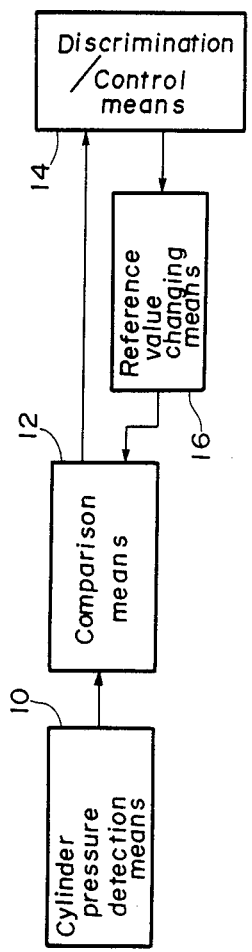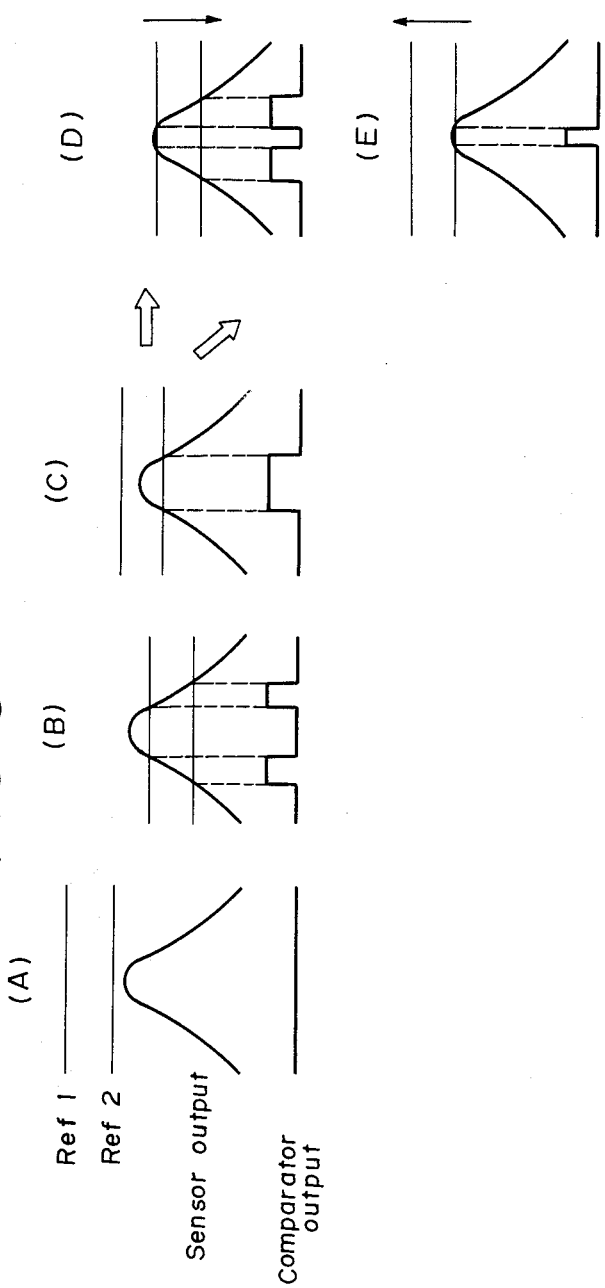

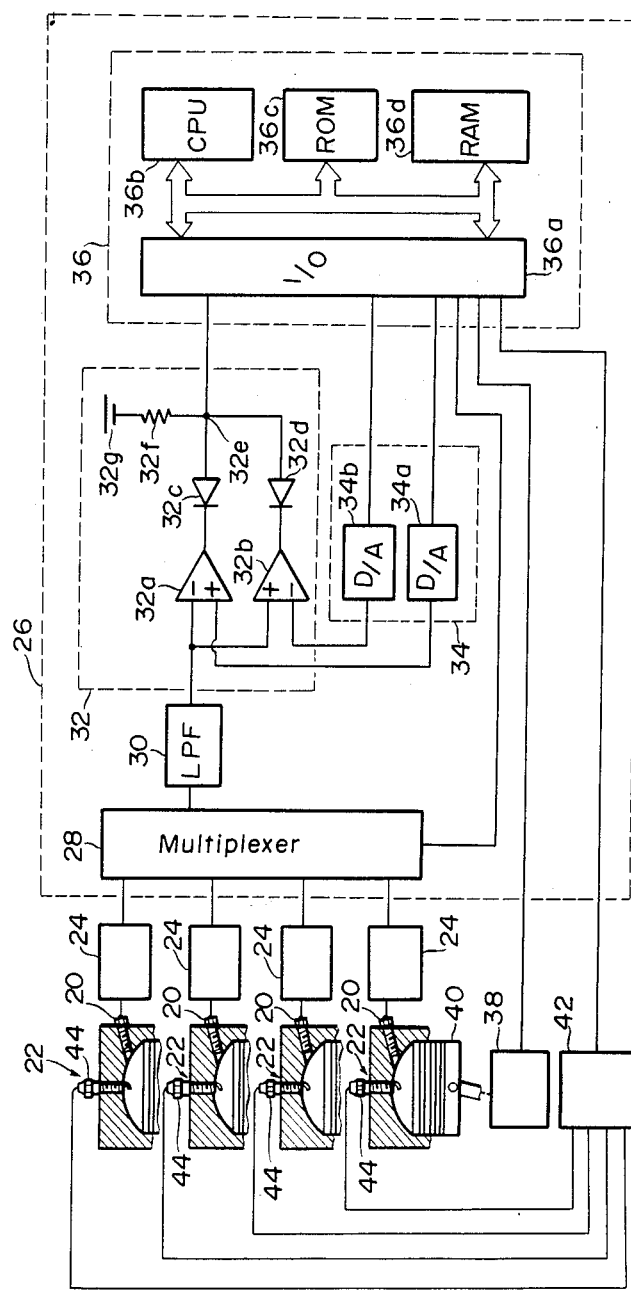

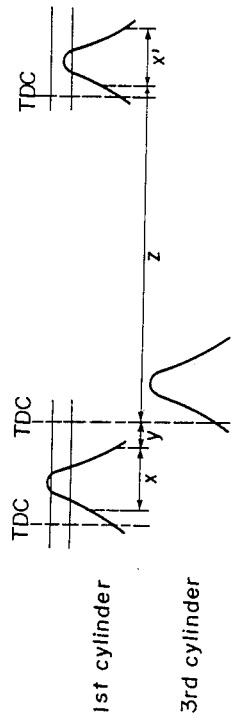
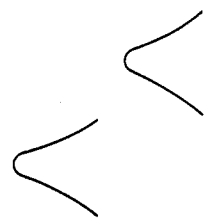
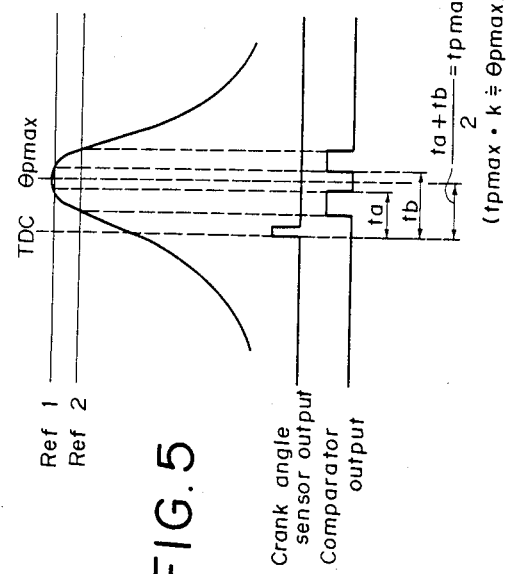
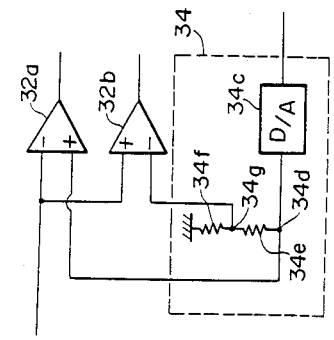
FIG. 4
FIG. 10
FIG. 5

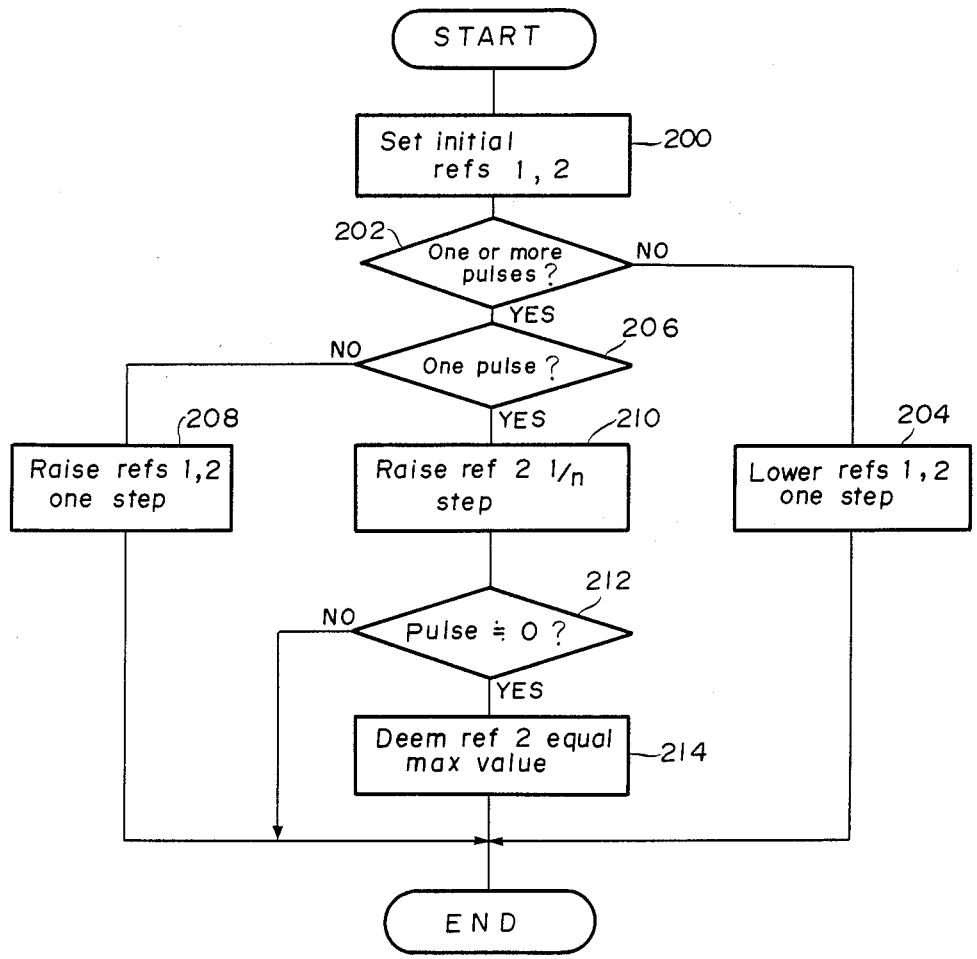

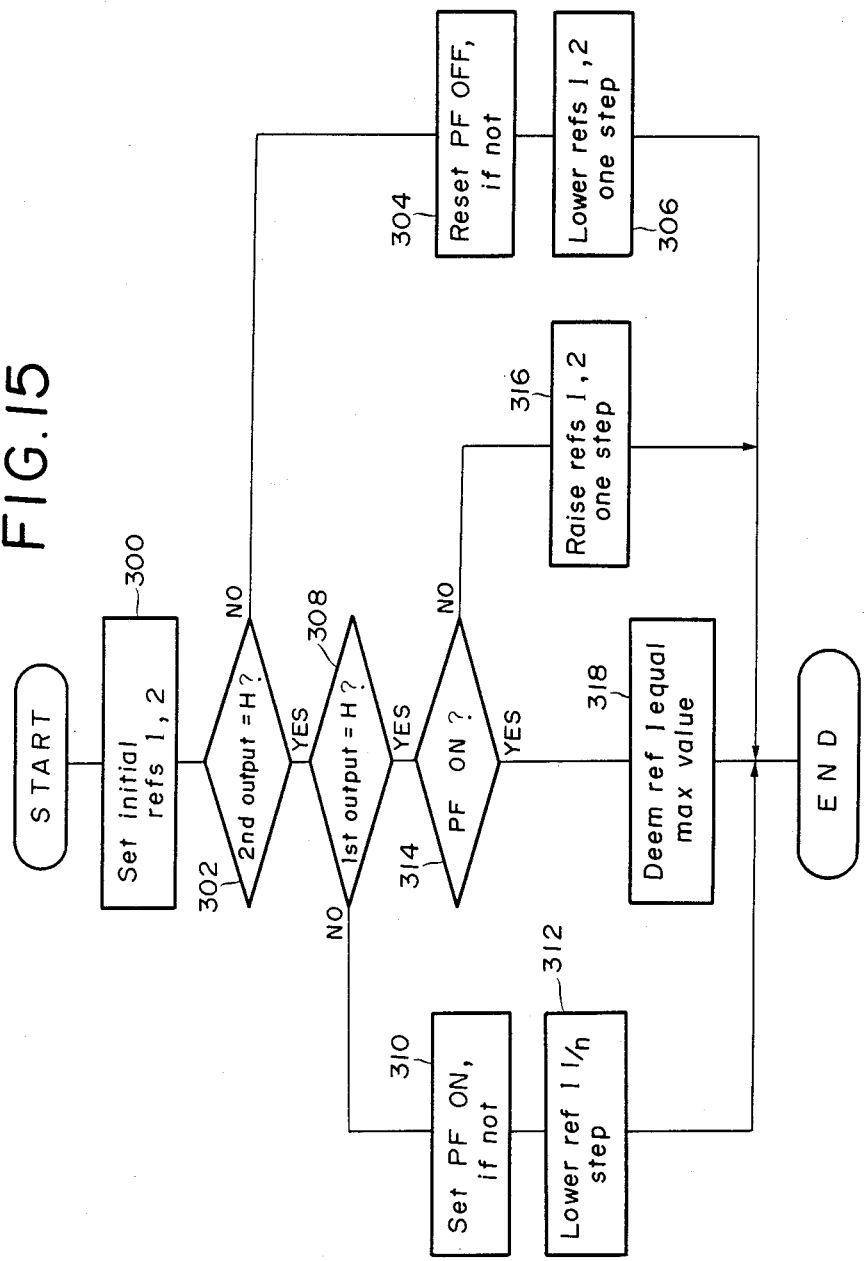

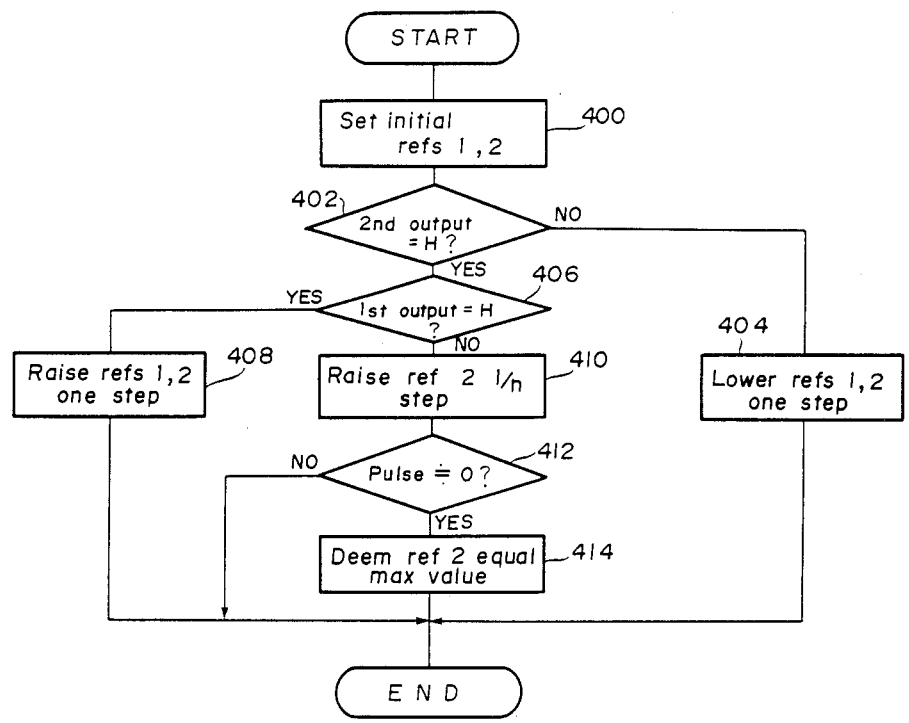

METHOD OF DETECTING CYLINDER PRESSURE AND CYLINDER PRESSURE DETECTION DEVICE IN INTERNAL COMBUSTION ENGINE

BACKGROUND OF THE INVENTION

1. Field of the Invention

This invention relates to a method of detecting cylinder pressure in an internal combustion engine and a cylinder pressure detection device for carrying out the method. More particularly, the invention relates to a method and a device for use in conjunction with the engine of an automobile or the like to detect the maximum value (Pmax) of the cylinder pressure and the crank angle at which the maximum value is reached.

2. Description of the Prior Art

Recent years have seen increasing adoption of methods for detecting cylinder pressure in internal combustion engines and using the detected values to control the operation of the engine as for example disclosed in Japanese Patent Publication No. 58(1983)-33394. Apart from this Publication, one of the various methods that have been proposed for this purpose is illustrated in FIG. 17.

As shown in FIG. 17(A), in this prior art method the output of a pressure sensor 500 fixed nearly at a cylinder combustion chamber is forwarded to a control unit 502, wherein it is applied to one input terminal of a comparator 504. A reference value from a decision unit 508, which may be a microcomputer or the like, is applied to the other terminal of the comparator 504 through a D/A converter 506. As shown in FIG. 17(B), the output of the comparator varies depending on the relationship between the waveform of the sensor output and the position of the reference value. While continuously discriminating the result of the comparison and changing the reference value accordingly, the decision unit determines from the pulse output by the comparator when the reference value has come in close proximity to the maximum output value of the sensor. The reference value at this time is deemed to approximate the pressure peak value.

However, since this conventional method uses only a single reference value for comparison with the pressure waveform, it is slow in detection speed and, particularly during high-speed engine operation, is incapable of adequately tracking the changes in cylinder pressure. Moreover, it is also less than satisfactory as regards accuracy.

SUMMARY OF THE INVENTION

The object of the present invention is to provide a method of detecting cylinder pressure and a cylinder pressure detection device in an internal combustion engine which are free of the aforesaid shortcomings of the prior art, exhibit excellent tracking properties and provide an improvement in accuracy.

The present invention provides an improved method of detecting cylinder pressure wherein the output of a cylinder pressure sensor is compared with a reference value, the result of the comparison is discriminated, the reference value is changed on the basis of the discrimination to approximate it to the maximum output value of the sensor, and the approximate reference value is deemed to represent the maximum pressure value, the improvement comprising setting two initial reference values of differing magnitudes, confirming whether the maximum output value of the sensor falls between the two reference values and if it dose not, changing at least one of the two reference values so that it does, changing at least one of the reference values so that one of the reference values approximates the maximum output value of the sensor, and deeming the one reference value approximated to the maximum output value of the sensor to represent the maximum cylinder pressure.

The invention further provides a cylinder pressure detection device comprising detecting means disposed on an internal combustion engine for detecting cylinder pressure, comparison means for receiving the output of the detecting means and comparing this output with two reference values of different magnitudes, discrimination/control means connected wtih the comparison means for discriminating the output thereof, and reference value changing means connected with the comparision means and the discrimination means, the reference value changing means changing the reference values in accordance with commands received from the discrimination/control means to cause one of the reference values to approximate the maximum output value of the sensor, this approximated reference value being deemed to represent the maximum cylinder pressure.

As the present invention provides two reference values against which the output of the pressure sensor is compared, the search time is shortened so that accurate tracking of the cylinder pressure is possible even during high-speed engine operation. Moreover, since one of the reference values is approximated to the maximum value of the cylinder pressure only after the two reference values have been adjusted so that the maximum value falls therebetween, it is possible to approximate the one reference value very closely to the maximum value, whereby the measurement error is minimized.

BRIEF DESCRIPTION OF THE DRAWINGS

These and other objects and advantages of the present invention will be more apparent from the following description and drawings in which:

FIG. 1 is a schematic view for explaining the structure of the cylinder pressure detection device according to the invention;

FIG. 2 is a block diagram showing the structure of the detection device according to this invention in greater detail;

FIG. 3 shows waveform diagrams of the output of the comparator circuit of the device of FIG. 2;

FIG. 4 shows waveform diagrams indicating the time relationships involved in the detection operation;

FIG. 5 is a waveform diagram for explaining a method of calculating the crank angle at the time of maximum cylinder pressure;

FIG. 10 is a partial block diagram of a third embodiment of the detection device according to the invention;

FIG. 14 is a flowchart showing a second embodiment of the detection method according to the invention;

FIG. 15 is a flowchart showing a third embodiment of the detection method according to the invention;

FIG. 16 is a flowchart showing a fourth embodiment of the detection method according to the invention.

DESCRIPTION OF THE PREFERRED EMBODIMENTS

Figure 6:
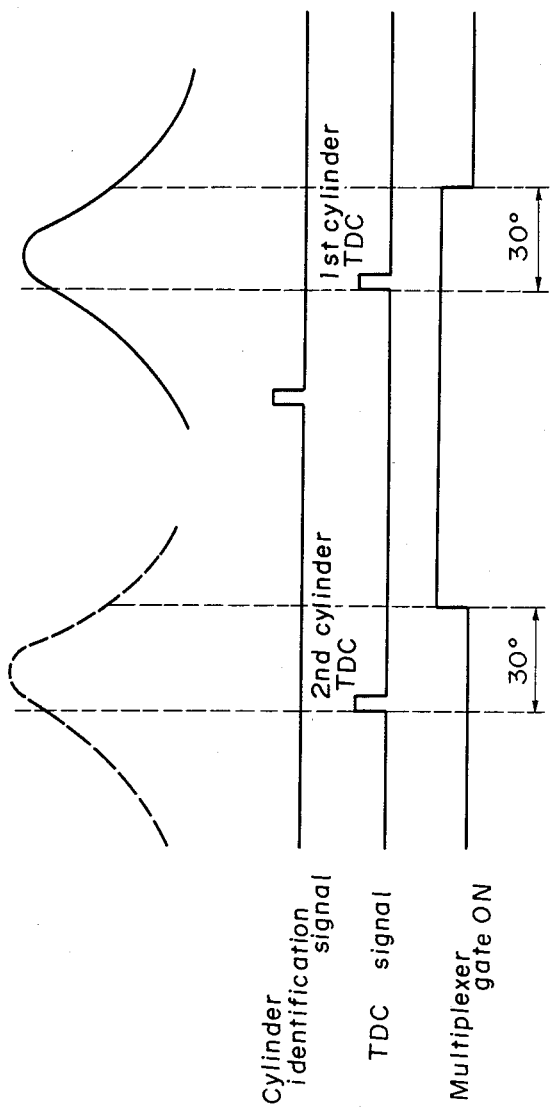
FIG. 6 is a timing chart showing the on/off interval of a mltiplexer gate.

To facilitate understanding of the invention, the cylinder pressure detection device will be described first.

The detection device according to the invention is schematically illustrated in FIG. 1. The detection device comprises cylinder pressure detection means 10 disposed on the internal combustion engine, a comparison means 12 for comparing the output of the pressure detection means with two reference values of different magnitude, a discrimination/control means 14 connected with the comparison means for discriminating the output therefrom, and a reference value changing means 16 connected with the comparison means and the discrimination/control means. The reference value changing means changes the reference values in accordance with commands received from the discrimination/control means so as to cause one of the reference values to approximate the maximum output value of the pressure sensor, i.e. to come into close proximity to the maximum output value. This approximated reference value is deemed to represent the maximum value of the cylinder pressure and is output as the detected result.

FIG. 2 is a block diagram showing the arrangement of the detection device described with reference to FIG. 1 in greater detail. In FIG. 2, the numerals 20 denote piezoelectric type pressure sensors which constitute the cylinder pressure detection means 10. The pressure sensors 20 are threaded externally and are screwed into internally threaded holes provided in the wall of a cylinder head 22 so as to face into the combustion chambers of the respective cylinders. The sensors are thus able to detect the combustion pressure within the respective cylinders. As will be noted, the present embodiment relates to a 4-cylinder engine.

The outputs from the four sensors are respectively forwarded to four charge amplifiers 24 for charge-voltage conversion and the converted signals are sent to a control unit 26 where they are applied to a multiplexer 28 serving as a gate means. The multiplexer 28 switches sequentially from gate to gate so as to forward the outputs of the four pressure sensors 20 to a succeeding stage low pass filter in the firing order of the clinders. (The operation of the multiplexer will be described more completely later.) The low pass filter eliminates high frequency components caused by knocking and the like.

The stage following the low pass filter is a comparison circuit 32 constituting the comparison means 12. In the illustrated arrangement, the cicuit 32 is constituted as a window comparator consisting of a first comparator 32a and a second comparator 32b. The inverting input terminal of the first comparator 32a and the noninverting input terminal of the second comparator 32b are connected to the output terminal of the low pass filter 30. One the other hand, the outputs terminals of the comparators are passed through diodes 32c and 32d, respectively, from where both are forwarded to a connection point 32e, which in turn is connected to a powe source 32g through a resistor 32f.

The numeral 34 denotes a reference value changing circuit corresponding to the reference value changing means 16 in FIG. 1. In the present embodiment, the reference value changing circuit 34 is constituted by a first D/A circuit 34a and a second D/A circuit 34b. The output terminal of the first D/A circuit 34a is connected to the noninverting input terminal of the first comparator 32a while the output terminal of the second D/A circuit 34b is connected to the inverting input terminal of the second comparator 32b.

Numeral 36 denotes a microcomputer which constitutes the discrimination/control means 14 in FIG. 1. The microcomputer 36 has an input/output (I/O) terminal board 36a, a central processing unit (CPU) 36b, a read-only memory (ROM) 36c and a random access memory (RAM) 36d. The microcomputer 36 receives the outputs of the first and second comparators 32a, 32b, from the connection point 32e and outputs reference values to the two comparators through the first and second D/A circuits 34a, 34b.

The numeral 38 denotes a crank angle sensor for detecting the angle of a crank shaft (not shown) to which pistons 40 are connected. The sensor 38 produces a cylinder identification signal once every 720° of rotation of the crankshaft, a top-dead-center (TDC) signal once every 180° rotation thereof, and a unit angle signal once every 30° rotation thereof, and forwards these signals to the microcomputer 36. The microcomputer 36 determines the maximum combustion pressure and the maximum pressure angle for the respective cylinders and, on the basis of the signal from the crank angle sensors 38, sets the ignition timing and, via a distributor 42 and spark plugs 44, ignites the fuel and air mixture in the combustion chambers of the respective cylinders.

The operation of the present device will now be explained with reference to FIG. 3.

The outputs from the pressure sensors 20 are forwarded through the multiplexer 28 and the low pass filter 30 and are applied to one input terminal of each of the first and second comparators 32a, 32b constituting the window comparator. Meanwhile, the microcomputer 36 outputs two reference values of differing initial value, which are forwarded to the first and second D/A converters 34a, 34b, respectively, to be analog-converted and forwarded to the respective other terminals of the comparators. Defining the reference value input to the first comparator as "ref 1" and that input to the second comparator as "ref 2", in the comparators the relationship between the output waveform of the pressure sensor and reference values becomes as shown in one of (A), (B) and (C) in FIG. 3. As a result, when refs 1 and 2 are both greater than (on the high voltage side of) the maximum value of the pressure sensor output waveform as shown in (A), the output of the comparison circuit becomes low (L) and no pulse is produced. In the case of (B), since the maximum value of the waveform is higher than both refs 1 and 2, the pulse output by the comparison circuit becomes hgih (H) only for the parts lying between refs 1 and 2 and remains L for the parts above and below the reference values. Thus two pulses are produced. In the case of (C), the maximum value of the waveform falls between ref 1 and ref 2 so that the output of the comparison circuit becomes H only for the part exceeding ref 2 and a single pulse is produced. In this way, it is possible to ascertain the relationship between the waveform and the reference values from the number of pulses output. Moreover, it is possible to ascertain the proximity between the maximum value of the waveform and the magnitudes of the reference values from the pulse width of a single pulse or from the interval between two pulses.

As the outputs of the two comparators, which represent the result of the comparison, are input to the microcomputer 36 through the connection point 32e, the microcomputer is able to discriminate the relationship as regards position and proximity and on the basis of this discrimination is able to change the reference values from their initial magnitudes and output the new reference value to the respective comparators via the respective D/A converters.

As regards the order of carrying out the operations, if the result of the comparison is such as shown in FIG. 3(A) or 3(B), the principle used is to first shift the reference values to obtain the situation shown in (C) and then to further shift them up or down to obtain the situation shown in (D) or (E). The relationship shown in (D) can be obtained from that shown in (C) by lowering ref 1 (toward the low voltage side) below the maximum value of the waveform. When this is done, the number of pulses output by the comparision circuit will increase to two just after ref 1 passes below the maximum value, giving an indication that the magnitude of ref 1 at this time is in very close proximity to the maximum cylinder pressure value (Pmax). The relationship shown in (E) can be obtained from that shown in (C) by raising ref 2 to cause the width of the pulse to narrow and eventually disappear. For reasons similar to those just explained, the value of ref 2 at this time can, for all intents and purposes, be presumed to be identical with the maximum cylinder pressure value.

A detailed explanation of the detection method used in conjunction with the operation of this device will be given.

FIG. 4 shows the time relationships involved in the detection operation. For ease of understanding, the explanation will be made with respect to a single cylinder, namely, 1st cylinder. Referring to FIG. 4, the pulse or pulses output by the comparison circuit during crank angle interval "x" are latched, the condition of the latched output pulses is discriminated during the interval "y", and the reference values are changed during the interval "z". In the cycles following the first, the same latching etc. of the pulses is repeated at interval "x" and so on. When the maximum value is once detected, there is used the final value of ref 1 and 2 in the preceding cycle. As a result, it is possible to reduce the number of changes made in the second and later cycles, thus enabling detection of the maximum value in a relatively short time.

FIG. 5 shows how, following the detection of the maximum cylinder pressure value, the crank angle at which the maximum value occurred (the maximum pressure angle $\theta pmax$) is obtained by a time/angle calculation. Assume, for example, that the maximum cylinder pressure was detected by finding the time at which two pulses were generated in accordance with the method used for FIG. 3(D). In this case, ref 1 is located directly below the maximum value and the peak of the waveform above ref 1 has a shape approximating an equilateral triangle, meaning that the midpoint between the two pulses can be discriminated as the position of the maximum cylinder pressure value. Therefore, the microcomputer 36 can use the TDC signal output for the cylinder concerned by the crank angle sensor 38 as a reference time point and can determine the lapse of time between this reference time point and the end of the first pulse (time interval "ta") and that between the same and the beginning of the second pulse "tb", whereafter the time lapse between the reference time point and the midpoint between the two pulses can be obtained as "(ta+tb)/2". Defining this value as "tpmax" and multiplying it by a time/angle conversion factor "k" compensated for the engine speed at that moment, it will be possible to obtain the crank angle in terms of the angular displacement from the crank angle at TDC. The factor k can be obtained as the product of the number of engine revolutions per second and 360°. Otherwise, it is possible to cause the crank angle sensor 38 to produce one or two unit angle signals and to directly obtain the angle by summing up the unit angle signals.

Figure 7:
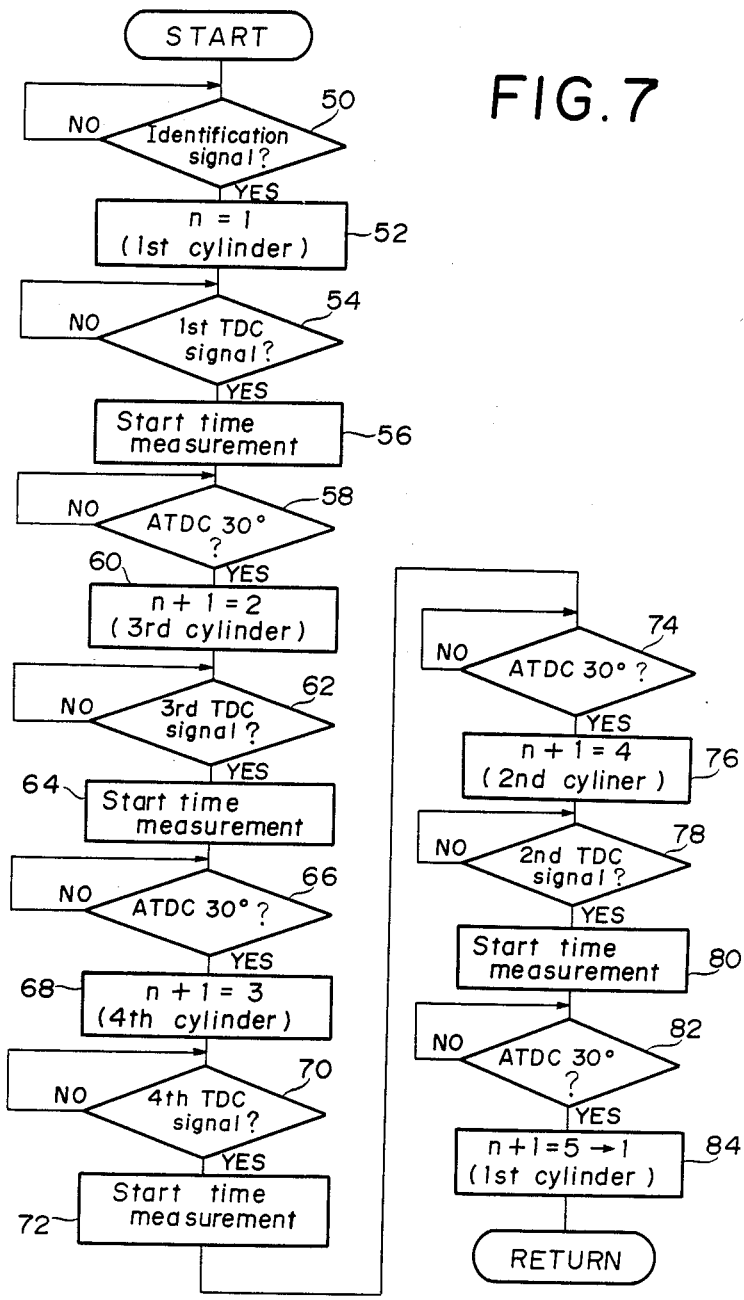
FIG. 7 is a flowchart showing the gate switchover operation of the multiplexer.

The gate switching operation of the multiplexer 28 will now be explained with reference to FIGS. 6 and 7. The multiplexer 28 functions to sequentially pass the outputs of the four pressure sensors 20 to the low pass filter 30 in accordance with commands received from the microcomputer 36. Taking the first cylinder in the firing order (i.e. 1st cylinder) by way of example, FIG. 6 shows the angular interval over which the output of the sensor associated with this cylinder is forwarded to the low pass filter 30. As will be noted, this interval has been set taking knocking detection and the like into consideration to extend from a point 30° after top dead center (ATDC) of the preceding cylinder in the firing order (2nd cylinder) to a point 30° ATDC of the present cylinder in the firing order (1st cylinder), where the firing order and the cylinder addresses are 1st cylinder (n=1), 3rd cylinder (n=2), 4th cylinder (n=3) and 2nd cylinder (n=4). Further, as the arrangement is such that the cylinder identification signal is produced at a prescribed angle following a point 30° ATDC of the final 2nd cylinder in the firing order but prior to the TDC of the 1st cylinder, it is possible to identify the cylinder by the arrival of the identification signal.

The operation of the multiplex will now be described mainly with reference to the flowchart of FIG. 7. Arrival of the cylinder identification signal is waited for in step 50. When its arrival has been confirmed, since it is then possible to identify the next cylinder to fire as the 1st, the cylinder address is set as n=1 in step 52. Then upon confirmation of the arrival of the TDC signal for the 1st cylinder in step 54, measurement of a 30° change in the crankshaft angle is started in step 56. (This measurement is made in terms of time by measuring the time required for the crankshaft to rotate by 30° at the current engine speed.) When the passage of the prescribed time has been confirmed in step 58, a command is sent to the multiplexer in step 60 so as to add 1 to the current address (n=1+1=2), thus changing the address to that of the 3rd cylinder and carrying out n=2 gate switching.

Thereafter, switchover is carried out similarly for the 4th and 2nd cylinders (steps 62–80), and when an advance in the crankshaft angle of 30° ATDC of the final cylinder in the firing order (2nd cylinder) is confirmed in step 82, a command is issued in step 84 to switch the gate to the 1st cylinder. For this it is defined that n=4+1=1. The sequential switching of the gates is thereafter carried out repeatedly in the same manner.

Figure 8:
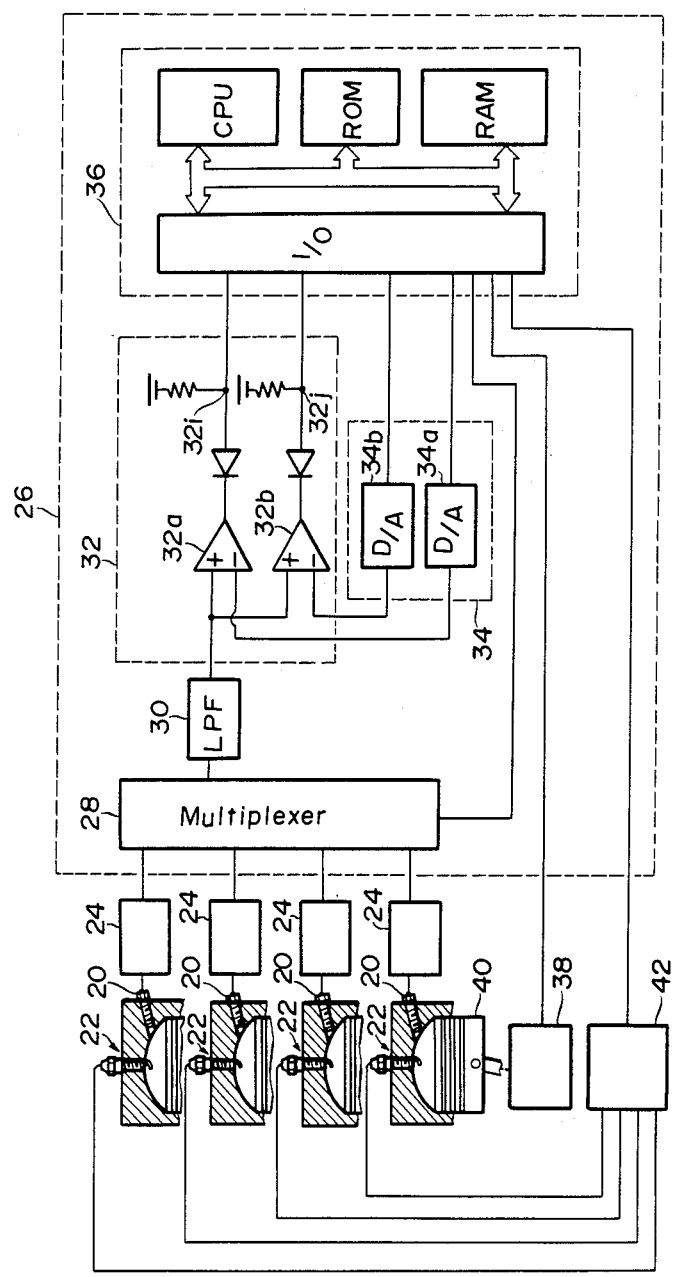
FIG. 8 is a block diagram similar to that in FIG. 2, but showing a second embodiment of the detection device according to the invention.
Figure 9:
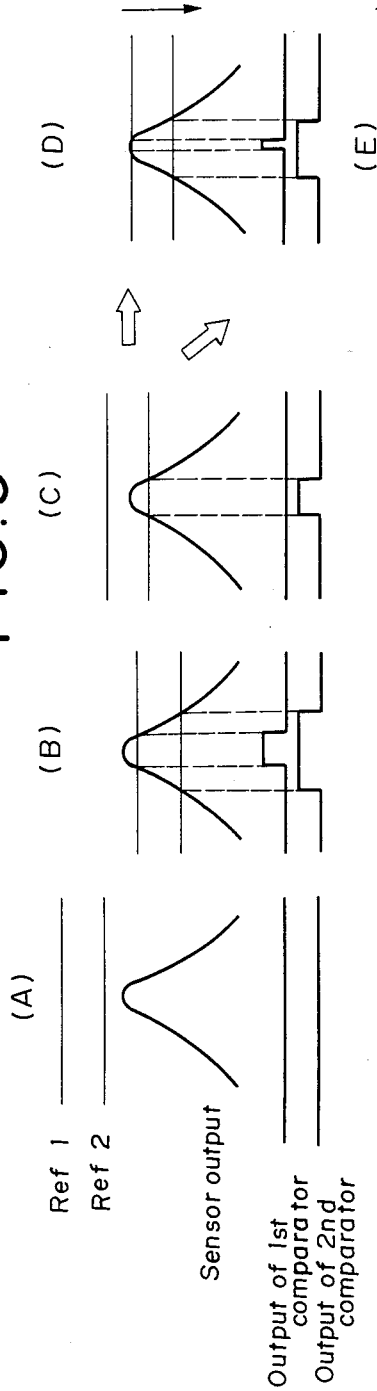
FIG. 9 shows waveform diagrams indicating the output of the comparator circuit of the embodiment shown in FIG. 8.
Figure 17:
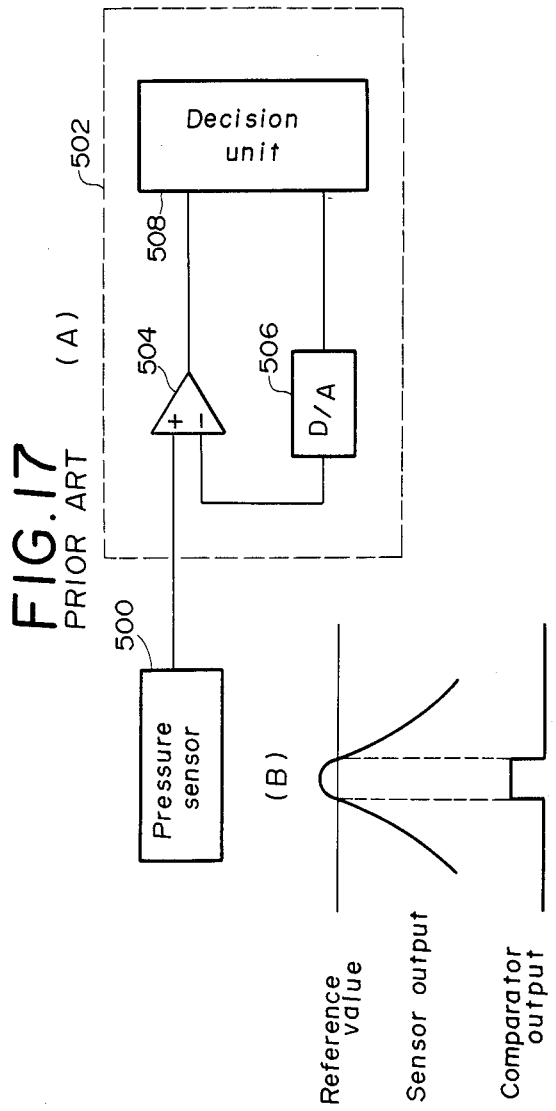
FIG. 17 shows an example of the prior art.

FIG. 8 is a block diagram illustrating a second embodiment of the device according to the present invention and FIG. 9 shows waveforms relating to this embodiment. This embodiment differs from the first mainly in that the outputs of the two comparators 32a, 32b are individually input to the microcomputer 36 through separate connection points 32i, 32j. Thus, as shown in FIG. 9, the comparison circuit 32 produces two outputs. Moreover, as regards the detection operation, it becomes possible to ascertain when the output of one of the comparators has gone from L to H (as shown in (D)) or from H to L (as shown in (E)). In other respects, this embodiment is the same as the first.

A third embodiment of the device according to the invention is shown in FIG. 10. In this embodiment the reference value changing circuit 34 is constituted as a single D/A converter 34c. The output terminal of the D/A converter 34c is connected with the noninverting terminal of the first comparator 32a and is also grounded at a point 34d via two resistors 34e, 34f. The connection point 34g between the two resistors is connected with the inverting terminal of the second comparator 32b so as to apply the divided voltage thereto. With this arrangement, the difference between ref 1 and ref 2 remains constant, and it is possible to realize a simpler circuit structure.

Figure 11:
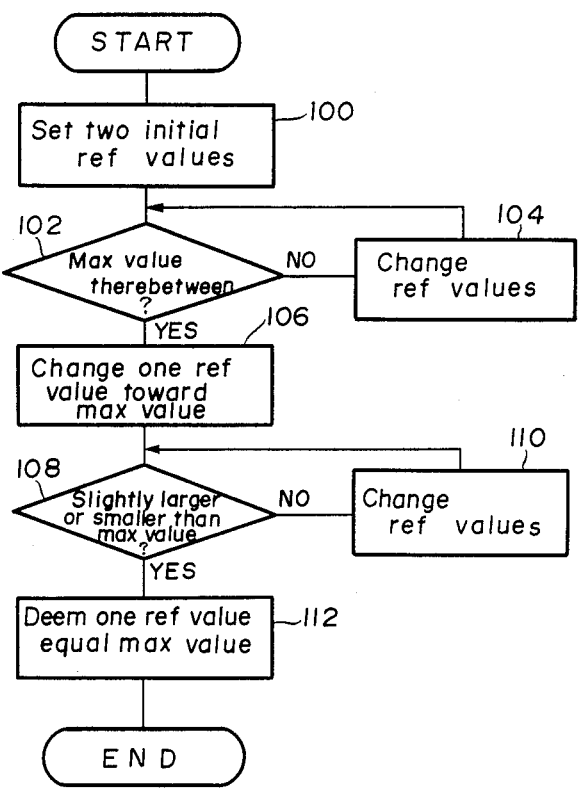
FIG. 11 is a flowchart for generally explaining the detection method according to the invention.

The methods of detecting the cylinder pressure will now be explained, beginning with the general description of the method employed by this invention with reference to FIG. 11. The present invention provides an improved method of detecting cylinder pressure wherein the output of a cylinder pressure sensor is compared with a reference value, the result of the comparison is discriminated, the reference value is changed on the basis of the discrimination to approximate it to the maximum output value of the sensor, and the approximated reference value is deemed to represent the maximum pressure value, the improvement comprising setting two initial reference values of differing magnitudes (step 100), confirming whether the maximum output value of the sensor falls between the two reference values and if it does not, changing at least one of the two reference values so that it does (steps 102, 104), changing at least one of the reference values so that one of the reference values approximates the maximum output value of the sensor (106), and when the magnitude of the one reference value becomes only slightly larger or smaller than the maximum output value of the sensor deeming the one reference value to represent the maximum cylinder pressure at the time (108–112).

Figure 12:
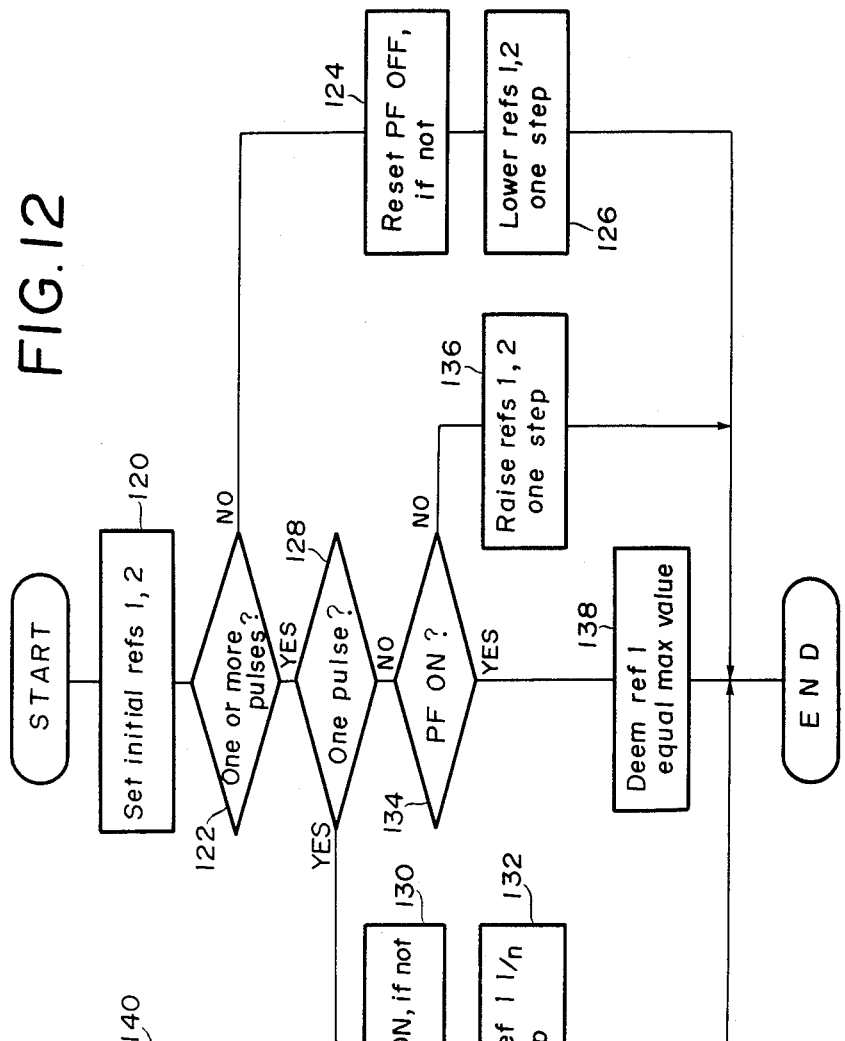
FIG. 12 is a flowchart illustrating the detection method according to the present invention in greater detail.

A more detailed explanation of the detection method according to this invention will now be given with reference to FIG. 12, which is a flowchart showing the method of FIG. 11 more concretely. At first two reference values, ref 1 and ref 2, are set at differing initial magnitudes (step 120). Next, in step 122, it is discriminated whether the result of the comparison has resulted in production of one or more pulses. If no pulse has been produced, this being indicative of the situation shown in FIG. 3(A), the pulse flag (PF) in the microcomputer 36, if not already reset, is reset in step 124, whereafter ref 1 and 2 are shifted downwardly by one step in step 126. Steps 124 and 126 are repeated until a pulse is produced. The "step" by which ref 1 and ref 2 are shited is equal to the difference in magnitude between the two reference values.

When the production of one or more pulses has been confirmed, the number of such pulses is discriminated in step 128. In the case of the situation represented by FIG. 3(C) the number of pulses is one so that the pulse flag is set in step 130 and ref 1 is lowered by 1/n step in step 132 in order to decrement its magnitude into proximity with the maximum value of the waveform. As the measurement error is reduced in proportion as the difference between the maximum pressure value and ref 1 becomes smaller, the decrementation of the magnitude of ref 1 at this time is conducted in very small steps. It should be noted that at this time ref 2 can either be left unchanged or be shifted together with ref 1.

If the decision in step 128 is that the number of pulses is not one, then since it has already been determined in step 122 that there is at least one pulse, it follows that the number of pulses is two. The procedure then proceeds to step 134 where it is decide whether or not the pulse flag is set. Although the procedure moves directly to step 134 in the case of an initial state like that shown in FIG. 3(A), this state can be discriminated from that of FIG. 3(B) since it does not involve the step of setting the pulse flag on. Therefore, in order to shift to the state shown in FIG. 3(C), ref 1 and 2 are raised one step in step 136 and this process is thereafter repeated until the pulse flag is set.

If the decision in step 134 is that the pulse flag is set, it can be judged that the state of detection has shifted to that of FIG. 3(D) so that the magnitude of ref 1 at this time can be deemed to approximate the maximum pressure value. The detection procedure is thus concluded.

It should be noted that the next detection operation required less time than the first since the values used for ref 1 and ref 2 in step 140 of the next detection operation are the final values reached in the first detection operation.

Figure 13:
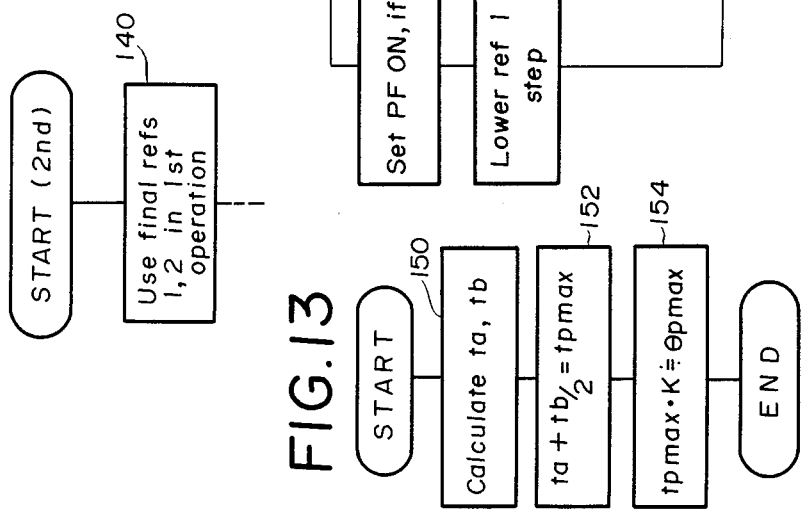
FIG. 13 is a flowchart showing a method of calculating the crank angle at the time of maximum cylinder pressure.

FIG. 13 is a flowchart of the procedures for calculating the crank angle ($\theta$pmax) at which the detected maximum cylinder pressure occurred. In line with what was explained in connection with FIG. 5, the times up to the two output pulses are calculated (step 150), the time up to the midpoint between these two times in calculated (step 152), and the calculated time is converted into an angular value (step 154).

FIG. 14 is a flowchart showing the procedures for carrying out a second method of detection in accordance with the invention. This embodiment relates to the case where the detection is conducted by shifting from the situation shown in FIG. 3(C) to that shown in FIG. 3(E) and it will be explained mainly in terms of how it differs from the first embodiment. After a single pulse has been obtained (steps 200–208), ref 2 is incremented upwardly (step 210) and the magnitude of ref 2 at the time the width of the pulse has been narrowed to a state immediately preceding extinction is output as the detected cylinder pressure magnitude. Aside from the fact that no pulse flag is used, this embodiment of the detection method is basically the same as the first embodiment. Again, the maximum pressure crank angle is determined in accordance with the flowchart of FIG. 13. The detection methods shown in FIG. 12 and FIG. 14 are carried out using the detection device shown in FIG. 2.

FIG. 15 is a flowchart showing the procedures for carrying out a third method of detection in accordance with the invention using the device shown in FIG. 8. In this embodiment too, two reference values, ref 1 and ref 2, are initially set at differing magnitudes (step 300).

Next, it is discriminated whether the result of one of the comparisons (the output of the second comparator) is H, i.e. whether or not a pulse has been produced. If no pulse has been produced, it can be discriminated that the situation is that shown in FIG. 9(A). Therefore, the procedure first moves to 304 where the pulse flag PF is reset if it has not already been reset, and then to step 306 where the reference values are changed, i.e. where the magnitudes of ref 1, 2 are lowered by one step. This process is repeated until production of a pulse has been confirmed. Upon confirmation of the production of a pulse at the output of the second comparator, the procedure moves to step 308 where it is discriminated whether or not the other comparison (that by the first comparator) has resulted in production of a pulse. If no pulse is produced by the first comparator, the situation can be discriminated to be like that shown in FIG. 9(C). In this case, the procedure moves to step 310 where the pulse flag is set and then to step 312 where ref 1 is lowered by 1/n step to decrement its value toward the maximum cylinder pressure value.

If the result of the decision in step 308 is that the output of the first comparator is H, then since it has already been determined in step 302 that the output of the second comparator is H, this means that the outputs of both comparators are H. The procedure then moves to step 314 where a decision is made as to whether or not the pulse flag has been set. If the initial situation was like that shown in FIG. 9(B), the procedure will have moved directly to step 314 without setting the pulse flag so that from the result of the decision in step 314 it is possible to discriminate whether the initial situation was like that shown in FIG. 9(B). If it is determined that it was, the situation is then shifted to that shown in FIG. 9(C) by raising refs 1, 2 by one step in step 316 and then repeating this operation until the pulse flag is set.

If the decision in step 314 is that the pulse flag is set, it can be discriminated that the situation has shifted to that shown in FIG. 9(D) so that in step 318 the magnitude of ref 1 at this time is determined to approximate the maximum cylinder pressure. The detection procedure is thus concluded.

FIG. 16 is a flowchart showing the procedures for carrying out a fourth method of detection in accordance with the invention. The procedure used by this embodiment is to shift from the situation shown in FIG. 9(C) to that shown in FIG. 9(E). The explanation will be focused on the points of difference with respect to the third embodiment. In this embodiment, after the output of only the second comparator has been made H (steps 400–408), ref 2 is incremented upwardly (step 410) until just before the pulse inverts (i.e. disappears) and the magnitude of ref 2 at this time is deemed to be the maximum cylinder pressure (steps 412–414). Aside from the fact that no pulse flag is used, this embodiment of the detection method is basically the same as the third embodiment.

In each of the four embodiments of the method of this invention described above, the reference values refs 1, 2 are adjusted together so as to position the maximum cylinder pressure value between them, whereafter one or both of the refs 1, 2 are varied. The invention is not limited to this procedure, however, and it is alternatively possible to use various other procedures such as, for example, always varying only one of the two reference values at a time. Also, while it was described that the adjustment of the reference values is carried out in large steps up to the time that the maximum cylinder pressure value comes to fall between them and is thereafter carried out in small increments, it is of course possible even after the maximum cylinder pressure value has been positioned between the two reference values to continue making the adjustment up to the vicinity of the maximum cylinder pressure value in large steps.

Since, as set out in the foregoing, the present invention carries out detection by first adjusting the magnitudes of two reference values until the maximum cylinder pressure falls therebetween and then bringing the magnitude of one of the two reference values into close proximity with the maximum cylinder pressure value, the time required for detection can be made short, whereby detection can be carried out with good tracking performance even when the engine is operating at high speed. Moreover, since two reference values are varied to once bring the maximum output value of the cylinder pressure sensor therebetween and then one of the reference values is approximated to the maximum output value, it is possible to bring the reference value exceedingly close to the maximum cylinder pressure value, whereby the amount of detection error can be reduced and the detection precision increased.

While the above description discloses preferred embodiments of the invention, it is to be understood that numerous modifications or alterations may be made without departing from the scope of the invention as set forth in the following claims.

What is claimed is:

1. In a method of detecting cylinder pressure in an internal combustion engine wherein the output of a cylinder pressure sensor is compared with a reference value, the result of the comparison is discriminated, the reference value is changed on the basis of the discrimination to approximate it to the maximum output value of the sensor, and the approximated reference value is deemed to represent the maximum pressure value, the improvement comprising the steps of:
   a. setting two initial reference values of differing magnitudes,
   b. confirming whether the maximum output value of the sensor falls between the two reference values and if it does not, changing at least one of the two reference values so that it does,
   c. changing at least one of the reference values so that one of the reference values approximates the maximum output value of the sensor, and
   d. deeming the one reference value approximated to the maximum output value of the sensor to represent the maximum cylinder pressure.

2. A method of detecting cylinder pressure as defined in claim 1 wherein the reference values are changed together.

3. A method of detecting cylinder pressure as defined in claim 2 wherein the differnce between the reference values is maintained constant as they are changed together.

4. A method of detecting cylinder pressure as defined in claim 1 wherein only one of the reference values is changed.

5. A method of detecting cylinder pressure as defined in any one of claims 1 to 4 wherein the amount of change in the reference values is smaller in step c than in step b.

6. A method of detecting cylinder pressure as defined in any one of claims 1 to 4 wherein the result of the comparison is output as one or more pulses and the result is discriminated from said pulse or pulses.

7. A cylinder pressure detection device comprising:
 a. detecting means disposed on an internal combustion engine for detecting cylinder pressure,
 b. comparison means for receiving the output of the detecting means and comparing this output with two reference values of different magnitude,
 c. discrimination/control means connected with the comparison means for discriminating the output thereof, and
 d. reference value changing means connected with the comparison means and the discrimination means,
 the reference value changing means changing the reference values in accordance with commands received from the discrimination/control means to cause one of the reference values to approximate the maximum output value of the sensor, this approximated reference value being deemed to represent the maximum cylinder pressure.

8. A cylinder pressure detection device as defined in claim 7 further comprising a gate means interposed between the means for detecting cylinder pressure and the comparison means, the gate means sequentially sending the outputs of the means for detecting cylinder pressure to the comparison means in the firing order of the cylinders.

9. A cylinder pressure detection device as defined in either one of claims 7 and 8 wherein the comparison means is a window comparator.

* * * * *